(12) United States Patent
Moloney

(10) Patent No.: US 8,713,080 B2
(45) Date of Patent: Apr. 29, 2014

(54) CIRCUIT FOR COMPRESSING DATA AND A PROCESSOR EMPLOYING SAME

(75) Inventor: David Moloney, Dublin (IE)

(73) Assignee: Linear Algebra Technologies Limited, Dublin (IE)

(*) Notice: Subject to any disclaimer, the term of this patent is extended or adjusted under 35 U.S.C. 154(b) by 1238 days.

(21) Appl. No.: 12/531,427

(22) PCT Filed: Mar. 14, 2008

(86) PCT No.: PCT/EP2008/053133
§ 371 (c)(1),
(2), (4) Date: Sep. 15, 2009

(87) PCT Pub. No.: WO2008/110633
PCT Pub. Date: Sep. 18, 2008

(65) Prior Publication Data
US 2010/0106692 A1 Apr. 29, 2010

Related U.S. Application Data

(60) Provisional application No. 60/911,273, filed on Apr. 11, 2007.

(30) Foreign Application Priority Data

Mar. 15, 2007 (GB) .................................. 0704976.0

(51) Int. Cl.
*G06F 7/00* (2006.01)
*G06F 7/48* (2006.01)

(52) U.S. Cl.
USPC ............................. 708/203; 708/169; 708/204

(58) Field of Classification Search
USPC .......................................................... 708/203
See application file for complete search history.

(56) References Cited

U.S. PATENT DOCUMENTS 3,553,651 A * 1/1971 Richard .................... 711/219
5,586,300 A * 12/1996 Wilcox et al. ............. 711/150
5,963,642 A * 10/1999 Goldstein .................. 713/193
6,591,019 B1 * 7/2003 Comair et al. ............. 382/248

FOREIGN PATENT DOCUMENTS

WO 0143074 A1 6/2001

OTHER PUBLICATIONS

Udo W. Pooch and Al Neider, A Survey of Indexing Techniques for Sparse Matrices, Jun. 1973, Computer Surveys vol. 5, No. 2, pp. 109-133, hereafter Pub.*
Salomon, D., ED, "Data Compression the Complete Reference, Passage" Data Compression: The Complete Reference, New York, NY Springer, US Jan. 1, 1998, pp. 6-10 XP002315914.
PCT Search Report, PCT/EP2008/053133, International Search Report, mailed May 14, 2008.

* cited by examiner

*Primary Examiner* — Henry Tsai
*Assistant Examiner* — Dean Phan
(74) *Attorney, Agent, or Firm* — Marsh, Fischmann & Breyfogle, LLP; Kent A. Lembke

(57) ABSTRACT

The present application addresses a fundamental problem in the design of computing systems, that of minimizing the cost of memory access. This is a fundamental limitation on the design of computer systems as regardless of the memory technology or manner of connection to the processor, there is a maximum limitation on how much data can be transferred between processor and memory in a given time, this is the available memory bandwidth and the limitation of compute power by available memory bandwidth is often referred to as the memory-wall. The solution provided creates a map of a data structure to be compressed, the map representing the locations of non-trivial data values in the structure (e.g. non-zero values) and deleting the trivial data values from the structure to provide a compressed structure.

20 Claims, 9 Drawing Sheets

CIRCUIT FOR COMPRESSING DATA AND A PROCESSOR EMPLOYING SAME

RELATED APPLICATIONS

This application is a national phase of PCT Application No. PCT/EP2008/053133, filed Mar. 14, 2008, entitled, "A CIRCUIT FOR COMPRESSING DATA AND A PROCESSOR EMPLOYING SAME," which claims priority from GB Patent Application No. GB0704976.0, filed on Mar. 15, 2007, and U.S. Patent Application No. 60/911,273, filed on Apr. 11, 2007, which are hereby incorporated by reference into this application.

FIELD

The present application relates to methods of data compression and in particular to the compression of structures.

BACKGROUND

Compression methods and algorithms are well known in the art for reducing the amount of data to be stored in memory. In particular, different algorithms are known for different types of data, e.g. JPEG for images.

The present application is directed to the compression of matrix structures.

One approach previously attempted (Moloney & Geraghty WO2006120664) involved compressing matrix structures by converting an unstructured matrix into a structured matrix. The compression method effectively eliminated duplication of data above and below the primary diagonal of the matrix.

Another method for dealing with matrix structures is proposed in U.S. Pat. No. 6,591,019 in which a matrix of data values is compressed into a structure comprising a bitMap table, a signMap table and a dataMap table. The bitmap table comprises a series of 2-bit entries, each 2-bit entry corresponding to an entry in uncompressed matrix structure. Each two bit entry in the bitMap identifies whether the corresponding value in the non-compressed matrix is either a zero or a one or stored in scaled form in the dataMap or stored in uncompressed form in the dataMap. The signMap table identifies the signs of the values in the non-compressed structure. A disadvantage of this method is that it is not lossless as information is lost in scaling values. The method is only practical for implementation in software.

Allthough each of the above methods offers an improvement over the prior art insofar as less memory is required to store the structures in memory, the methods still incur a significant computation cost when decompressing the structures in the processor. Additionally both of the above methods also suffer in terms of processing speed owing to their relative complexity in terms of both compression and decompression, which when run on a processor results in an apparatus which is relatively large and slow in terms of performance.

The present application addresses the problem in the design of computing systems of minimising the cost of memory access while minimising the implementation cost and maximising the compression/decompression speed of the implementation. The cost of memory access (memory bandwidth) is a fundamental limitation on the design of computer systems as regardless of the memory technology or manner of connection to the processor, there is a maximum limitation on how much data can be transferred between processor and memory in a given time, this is the available memory bandwidth and the limitation of compute power by available memory bandwidth is often referred to as the "memory-wall"

The present application seeks to increase the effective memory bandwidth and minimise the limitation of the "memory-wall" on computation by storing data in a compressed format, and providing a means of compression and decompression which is suitable for block-structured data used in many applications such as computer graphics, rigid-body dynamics, finite-element analysis and other scientific and engineering applications, which operate on large data sets which must be stored in memory.

SUMMARY

The present application addresses the problem of the memory wall by incorporating a compression\decompression circuit into the hardware of the processor so that the data transfer and decompression does not occupy processor resources and there is no significant delay while remaining low in terms of implementation cost and fast in terms of processing speed. An advantageous compression method is provided which allows for relatively simple compression\decompression hardware.

A first embodiment provides a circuit comprising a memory for storing a structure of individual data values, a map memory for storing the locations of non-trivial (non zero) values within the structure, a data output, wherein the circuit is configured to retrieve non-trivial (non zero) data from the memory using the map and provide the retrieved data as a compressed structure on the data output. The memory suitably comprises a register, a plurality of registers and\or a register file. The locations may be stored as a bit map, each bit in the bit map may correspond to an individual data value in the stored structure. A plurality of comparators may be provided, each comparator identifying whether a data value is non-trivial, the output of each comparator being provided as an input to the map. The comparator inputs may be provided by read ports of the memory, write ports of the memory and\or a processor load/store ports.

The data output may comprise a data bus and the circuit is configured to sequentially output the compressed structure from the memory onto the data bus. The circuit may further comprise at least one adder for calculating the number of non-zero values from the map. The circuit may further comprise logic for sequentially enabling the writing of non-zero data from the memory to the data output. The logic may comprise an arrangement of adders, wherein each subsequent adder in the arrangement has as an input the output of the preceding adder in the arrangement. Each adder may correspond to an associated data value in the structure and each adder accepts an input from the map corresponding to the associated data value. The circuit may further comprise a tree of integer comparators, each integer comparator for comparing two integer inputs, the first input of each comparator being an output from a corresponding adder in the adder tree. The second input to each comparator is a sequencing signal. The circuit may further comprise a combiner for combining the values from the map with individual comparator outputs to ensure the correct sequence of writing non-trivial data to the data output. The circuit may further comprise a controller for controlling the operation of the circuit. The circuit may be adapted to also provide the contents of the map as an output. Suitably, the circuit may be provided on an integrated circuit. A processor may be provided comprising one or more of the circuits In a further embodiment, a circuit is provided for extracting a decompressed structure from a compressed structure. The circuit comprises an input for accepting a compressed structure of individual non-trivial data values, a map register for receiving a map identifying the locations of the non-trivial data values within the decompressed structure, a memory for storing the decompressed structure, wherein the circuit is configured to populate the memory with individual inputted non-trivial data values in accordance with the contents of the map register. The memory may comprise a plurality of registers or a register file. The locations may be stored as a bit map, with each bit in the bit map corresponding to an individual data value in the decompressed structure.

The data input may comprise a data bus and in which case the circuit is configured to sequentially input the compressed structure from the data bus into the memory. The circuit may further comprise at least one adder for calculating the number of non-trivial values from the map. The circuit may further comprise logic for sequentially enabling the writing of non-trivial data from the data input to memory, suitably an arrangement of adders. Each subsequent adder in the arrangement may have as an input the output of the preceding adder in the arrangement. Each adder may correspond to an associated data value in the uncompressed structure and each adder accepts an input from the map corresponding to the associated data value. The circuit may further comprise an arrangement of integer comparators, each integer comparator being for the purpose of comparing two integer inputs, the first input of each comparator being an output from a corresponding adder in the adder arrangement. The second input to each comparator may be a sequencing signal. The circuit may further comprise a combiner for combining the values from the map with individual comparator outputs to ensure the correct sequence of writing non-trivial data to the data output. The circuit may further comprise a controller for controlling the operation of the circuit. The circuit may further comprise a map input, wherein the circuit is adapted to load a map from the map input into the map register. Suitably, the circuit may be provided on an integrated circuit. Suitably, the trivial data value is a zero data value and the non-trivial data values are non-zero data values. The application extends to a processor incorporating at least one of these circuits.

Yet a further embodiment provides a processor chip comprising a compression circuit responsive to an instruction to store a data structure, the compression circuit being adapted to remove trivial-values from the structure to provide a compressed format for storage. The compression circuit may be adapted to provide a map identifying the locations of trivial-values in the structure. The processor may further comprise a decompression circuit responsive to an instruction to load compressed format data, the decompression circuit being adapted to repopulate trivial-values into the compressed data as it is loaded. The decompression circuit may employ a map to repopulate trivial-values. Suitably, a trivial data value is a zero data value and the non-trivial data values are non-zero data values.

Accordingly, another embodiment provides a lossless method of compressing a structure of data values, comprising the steps of: creating a single map identifying the locations of trivial-entry values within the structure, and removing the identified trivial-entry values from the structure to provide a compressed structure which can be decompressed solely from the information in the single map. The data values may be floating point numbers (single or double precision), extended precision floating point numbers, 128-bit precision floating point numbers or integers.

Suitably, the map comprises a bitmap with each bit of the bit map representing an individual data value. The step of identifying the locations may comprise comparing each data value to determine if it is a non trivial-entry value. The outputs of each comparison may be summed to provide a count for the number of non trivial-entry values. The count may be employed to determine the size of the compressed structure and/or the number of entries to be provided in the compressed structure. The outputs of each comparison may be employed to enable writing of data values to the compressed structure. The structure may be a matrix and the map may identify the number of columns and rows. In an advantageous arrangement, the trivial-entry values are zero values and the non-trivial values are non-zero.

A further embodiment provides a compressed data structure comprising a plurality of non trivial data values and a map representing the positions of trivial data values relative to the plurality of non trivial data values. In an advantageous arrangement, the trivial-entry values are zero values and the non-trivial values are non-zero. The map may comprise a bit map, with each individual data value represented by an individual bit.

A further embodiment provides a method of decompressing a compressed data structure, the compressed structure comprising a plurality of non trivial data values and a map representing the positions of the non-trivial values in an uncompressed structure. The method comprises the steps of providing an unpopulated uncompressed structure, retrieving the non-trivial values, and populating the non-trivial values within the unpopulated structure according to their positions represented in the map to provide a populated decompressed data structure. In an advantageous arrangement, the trivial-entry values are zero values and the non-trivial values are non-zero. In this case, the values in the unpopulated matrix may be initialised to zero before population by the non-zero values. Alternatively, the locations in the populated structure identified as zero values in the map may be set to zero. The map may comprise a bitmap with each bit of the bit map representing an individual data value. The individual bits of the bitmap may be summed to provide a count for the number of non-zero values in the compressed structure. The count may be employed to determine the amount of data values to be read into the unpopulated structure. Suitably, the map is employed to enable the writing of data values to the uncompressed structure. The structure may comprise a matrix having a row-column configuration.

These and other embodiments, features and advantages will become apparent from the exemplary description which follows.

BRIEF DESCRIPTION OF THE DRAWINGS

The present invention will now be described with reference to the accompanying drawings in which.

DETAILED DESCRIPTION OF THE DRAWINGS

The present application adopts a new approach to exploiting zero data values contained in large floating-point matrix data-sets such as those used in 3D computer graphics, game physics (rigid-body dynamics), Finite-Element Analysis (FEA) and Search Engines. However, the application is suitable to other data structures and is not limited solely to matrix based structures.

It has been recognised by the inventor, that for many matrices, a significant number of the entries are zero fill which nonetheless occupy 32 or 64 bits in floating point representation, which must be fetched from on or off-chip memory and can keep the processor busy performing trivial operations on zeroes fetched from memory or registers.

The present application provides for the storing a matrix structure arranged in rows and columns of data values in a compressed structure in which zero data values have been removed. An associated map is provided for the compressed structure which identifies the locations of zero and non-zero values in the matrix structure and allows for the loss-less reconstruction of the matrix structure. It will be appreciated that such a map may be regarded as identifying the locations of the trivial values or as identifying the locations of the non-trivial values, since it is clear that if a value is not identified as a trivial value, it is a non-trivial value and vice versa. This method provides a number of significant advantages over the prior art. Firstly, the method is lossless and secondly the method may readily be implemented in hardware thus reducing the computational load normally associated with decompressing compressed structures when loaded into memory. Similarly, data can be stored in compressed form without incurring additional processing resources.

This map may be stored in memory either along with the compressed structure or as part of an indexing structure where random access to complex data-structures is required.

The advantage of the present technique is that it reduces the transfer requirements from memory for zero value numbers from 32 bits to 1 bit for single precision values, or from 64 bits to 1 bit for double-precision values, assuming a 32-bit bitmap is used to represent up to 32 data-structure entries. Obviously the bitmap size can be adjusted to provide for data-structures with more or less than 32 entries without any loss of generality. The same advantage may also be obtained with integer values.

Figure 1:
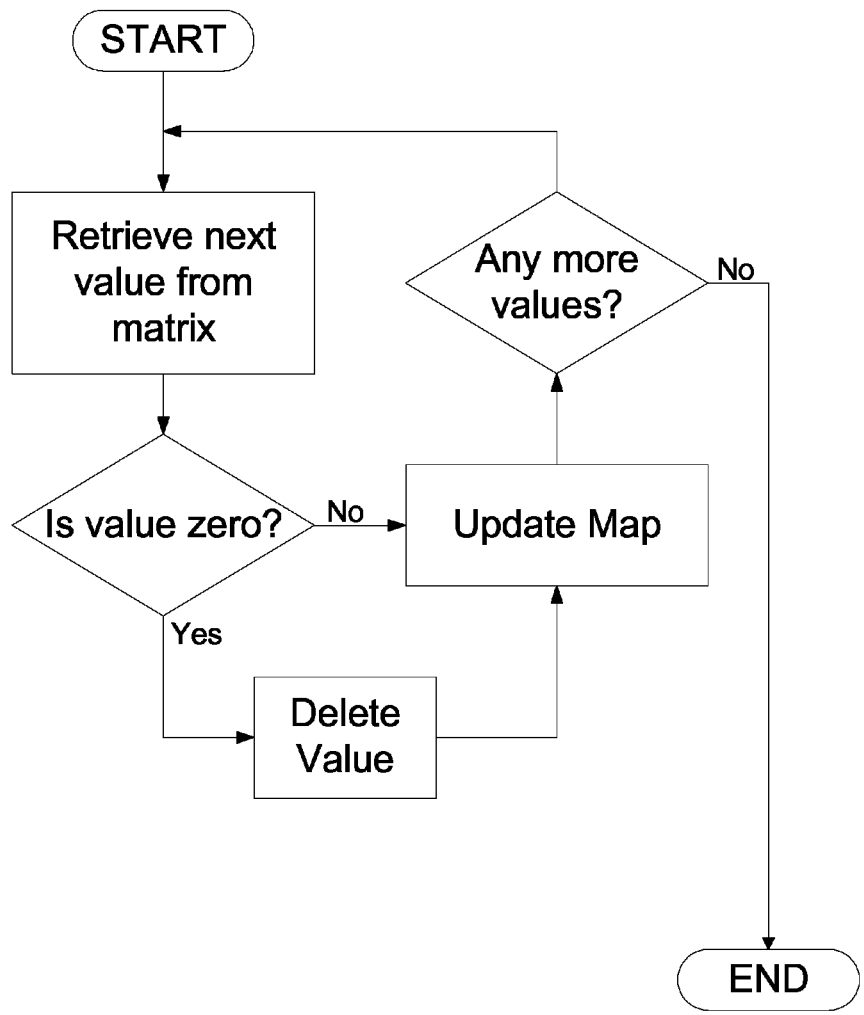
FIG. 1 is an exemplary flowchart of a method of compression according to the present application.

The mode of operation will now be described with reference to the exemplary sequential flowchart of FIG. 1 and the exemplary 4×4 matrix containing sixteen 32-bit single precision entries of FIG. 2.

The process starts by retrieving the first entry from the matrix structure to be compressed. The first entry is compared to determine whether it is a zero value or a non-zero value. Depending on the result of the comparison, an entry is made in the first position of a map to identify the first value as a zero or as a non-zero value. Suitably, the map is a bitmap with each value in the matrix structure having an associated bit in the bitmap. In the case where the first entry is a zero value, the entry is discarded, deleted or tagged for later disposal or deletion (for example during the transfer of the matrix data to compressed storage) and an entry is made in the first position of the map for the matrix to indicate that a zero value was present, e.g. by setting the first bit to be zero. In the case where the first value in the matrix is a non-zero value, for example the first entry in FIG. 2 of 1.0, the first entry in the map is set to 1 indicating a non-zero value. At the same time the first entry is stored as the first entry in the compressed structure.

The process is then repeated for each remaining entry in the matrix. In the exemplary matrix shown, the entries are scanned row by row, although it will be appreciated that a column by column scanning may also be employed, or that multiple comparators may be employed to generate an entire row/column of the bitmap in a single operation rather than sequentially using a single comparator.

Thus for the first row having values, 1.0, 2.0, 3.0 and 4.0, the corresponding map is 1111 since none of the entries are zero values, whereas in the second row the map is 0100 since only the second value is a non-zero value (6.0). Similarly, for the third row only the last entry in the map is a one since the first three values in the row are zero.

The result of the compression process is that the matrix previously stored as 16 entries in memory (32 bits each for single point precision) may be replaced by a compressed matrix of 9 entries (also at 32 bits each) and a 16 bit map representing the positions of these non zero values and correspondingly the zero values in a non-compressed matrix. As each memory location is 32 bits, 32 bits rather than 16 are required for storage of the map where the map is stored with the matrix. Nonetheless, the 16×32 bits uncompressed matrix format (512 bits total) has been replaced with a 9×32 bits compressed matrix and 1×32 bit map (320 bits total) representing a compression of (512-320)/512=37.5%.

Compression is achieved as long as 1 or more entries per dense-matrix (including zero-fill) are zero (in the case where a 32-bit bitmap is employed); however there is a penalty of 1 bit per entry for non-zero entries which may result in more memory being used to store dense data-sets with no zero-fill. In practice the data-sets of interest including 3D computer graphics, game physics (rigid-body dynamics), Finite-Element Analysis (FEA) and Search Engines (ex. Google) are sparse and contain a large amount of zero-fill.

Whilst the present application is described in terms of multiple rows and columns, it is also applicable to compression of structures comprising a single row or column.

It will be appreciated that in some circumstances it may be necessary to know the column-row structure, i.e. the numbers of rows and columns, of the matrix in order to reconstitute the matrix. However in a significant number of applications this is largely irrelevant as the contents are retrieved from memory and stored in a register in scalar form, i.e. as shown in the single column of FIG. 2, and it is the software\processor that treats the data as a matrix. In addition, provided there is consistency between the manner of compression and decompression, the row-column structure may implicitly be present. In circumstances, where knowledge of the column-row structure is required, this may be included within\appended to the map.

Figure 3:
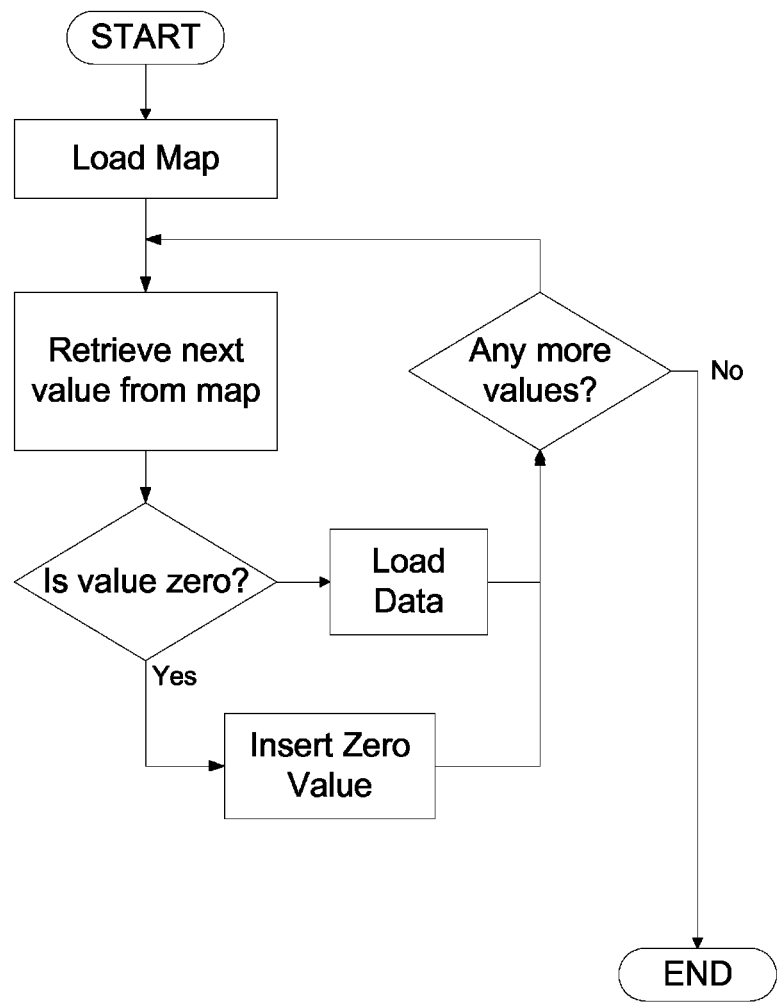
FIG. 3 is an exemplary flowchart of a method of decompression according to the present application.

The process of expanding a compressed structure into an uncompressed structure, as shown in FIG. 3, is the reverse of the compression method. The method commences by providing an empty uncompressed structure and loading the map. The first bit in the map is then compared to determine if it is a zero or a non-zero value. Where the first bit is a one, the first data value is loaded from memory into the first entry of the uncompressed structure. Similarly, where the first bit is a zero, a zero value is inserted into the first entry in the uncompressed structure. In cases where all values in the uncompressed structure have been initialised to zero, no specific step of inserting a zero value shall be required. The process is repeated until the end of the map has been reached or until all data values have been loaded. The number of data values to be loaded may be simply calculated by counting the individual non-zero bits (corresponding to compressed non-zero matrix/vector entries) in the map.

Figure 2:
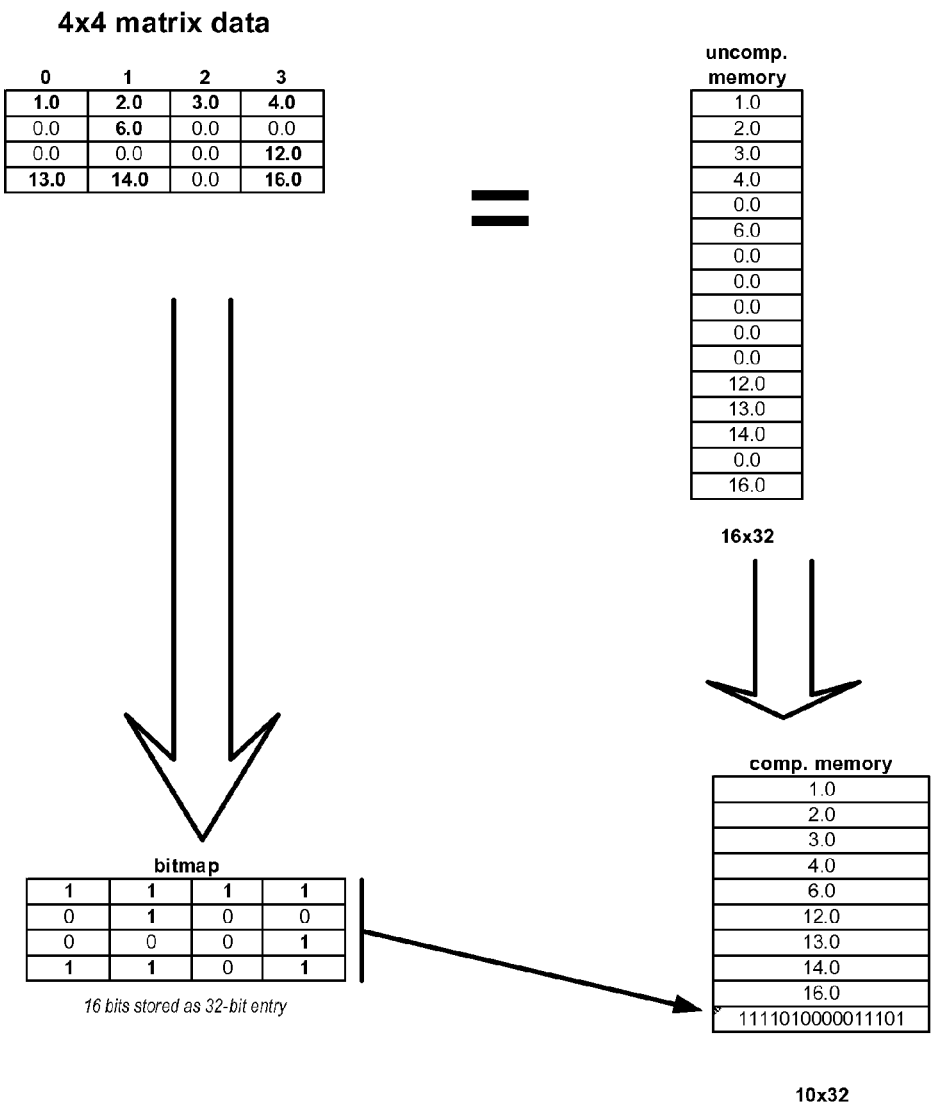
FIG. 2 is an example of an uncompressed structure and its resultant compressed structure as the result of the method of FIG. 1.

In the case of decompressing the compressed structure of FIG. 2, as the first four values in the map are 1, the first four data values will be loaded from the compressed structure into the first four entries of the uncompressed structure. As the fifth bit in the map is a zero, the fifth entry in the uncompressed structure will be populated with a zero value and so on.

Even when a compressed structure is expanded to an uncompressed structure, the map for the compressed structure may be retained and subsequently employed to significant advantage. In particular, the map may be used to advantage in the control of functional units within a processor as the results of a multiplication, addition or other arithmetic operation as described in a co-pending application of the applicant.

For efficiency, where a matrix structure is relatively large in size, it may be divided into a plurality of sub-matrices, each of sub-matrices representing a portion of the matrix structure. In this arrangement, each of the sub-matrices may be compressed individually in the manner described above.

Figure 4:
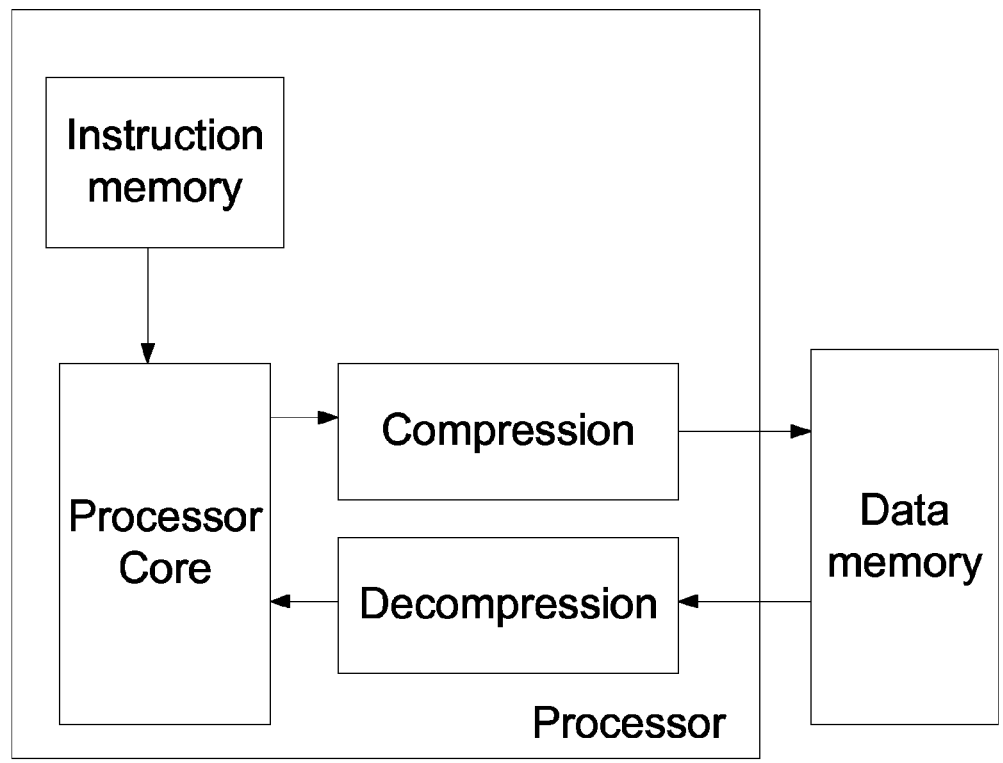
FIG. 4 is an exemplary processor according to the present application.

Although, the above method may be implemented in software, a significant advantage in processing speed may be obtained where the data is decompressed and compressed in hardware as it is moved to and from the processor as shown in FIG. 4. It will be appreciated that the selected compression structure is particularly suited to implementation in hardware in contrast to prior art methods which include scaling and other manipulations. In the hardware arrangement, the processor may be adapted to have specific instructions for storing and\or retrieving data in block form, e.g. storing\retrieving a matrix. In such an arrangement, the compression and decompression processes\hardware may be transparent to the central processor core although as explained above there may be significant advantage to employing the map in the processor itself and similarly as will be discussed there may be advantage to generation of the map within\in combination with the processor hardware. It will be appreciated that in any event, the operation of the compression\decompression may advantageously be performed in a manner which is substantially transparent to the programmer\operating software.

It will be further appreciated that although the present application has been described with reference to the loading and storing of data from on or off-chip memory to a processor, it will be appreciated that a variety of other applications are possible, including for example in the sharing of data between co-processors.

An exemplary hardware implementation providing for the decompression\expansion of a compressed data structure as it is loaded from memory to the processor will now be described. For the purposes of illustration a relatively small 3×3 (9-entry) compressed matrix is used, illustrated in table 1 below, where A, B, C, D & E represent non zero data values and 101010101 is the map for the non-zero values in the 3×3 matrix. In practice the proposed technique can be extended to any arbitrary-sized N×M matrix and register file with greater than or equal to N×M entries which serves as the destination for decompressed data.

TABLE 1

A
B
C
D
E
101010101

Figure 5:
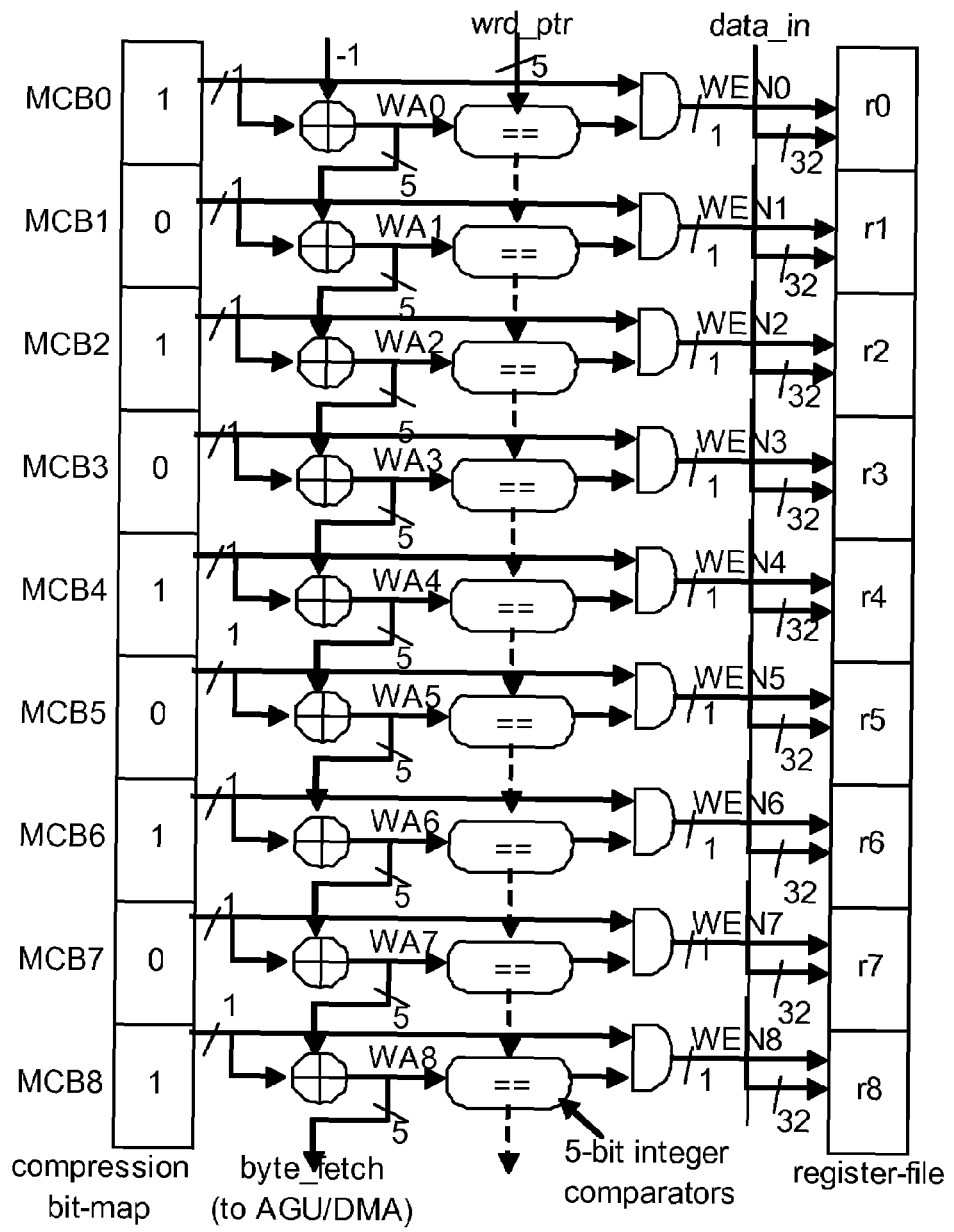
FIG. 5 is an exemplary decompression circuit suitable for inclusion in the processor of FIG. 4.
Figure 6:
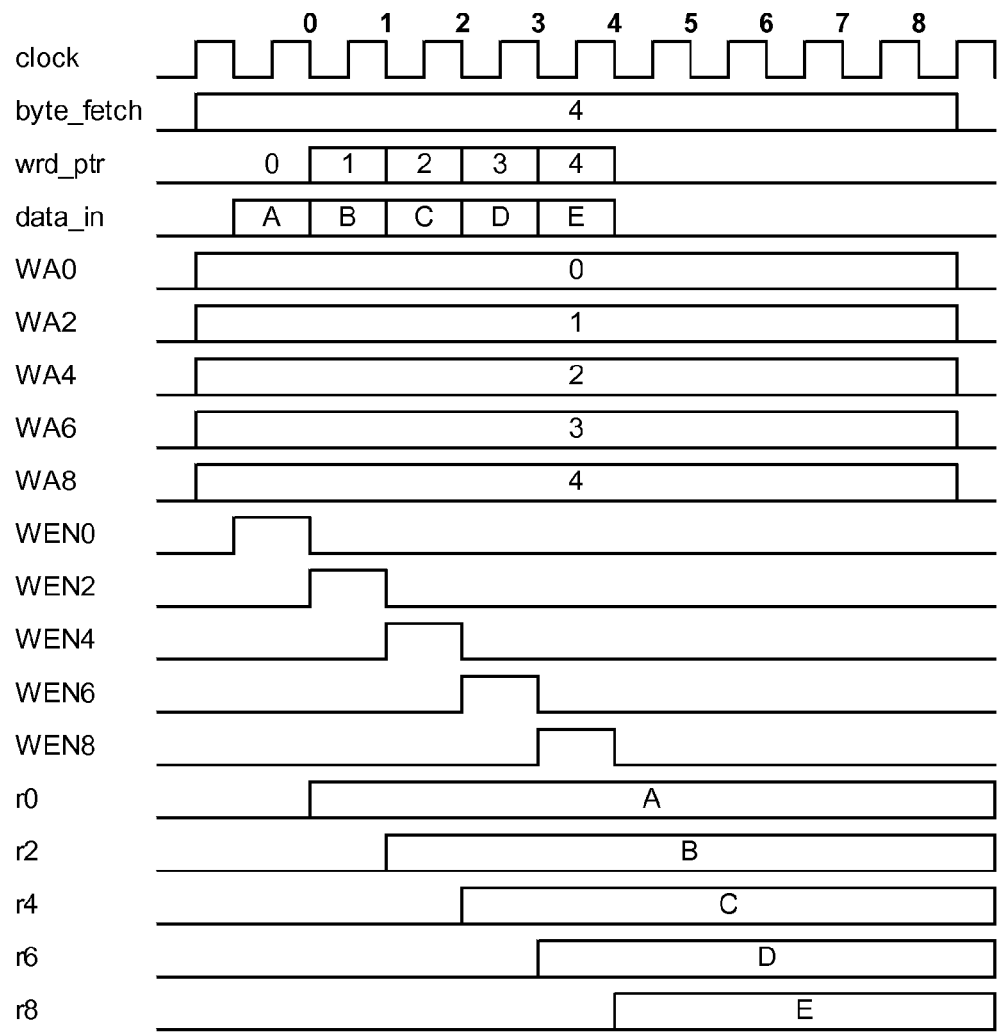
FIG. 6 is an exemplary timing diagram to explain the operation of FIG. 5.

The exemplary decompression logic, as shown in FIG. 5, comprises a compression bitmap register, a write address calculator, write address comparators, a combiner and destination on-chip memory. In the exemplary arrangement, these elements are under the control of a controller, for example an Address Generation Unit (AGU) or Direct Memory Access (DMA) controller. The construction and operation of these elements will now be explained in greater detail with reference to the exemplary timing diagram of FIG. 6.

The compression bitmap register is a register of sufficient size to store the map for the compressed matrix structure, in practice this corresponds to a 1-bit entry for each entry in the N×M compressed matrix to be supported. In the exemplary arrangement the compression bitmap register comprises 9 bits (MCB0-MCB8), each bit corresponding to a location in the uncompressed structure. At the start of an expansion process, the controller loads the map from on or off-chip memory into the compression bitmap register. It will be appreciated that the values shown in the bitmap register in FIG. 5 are purely exemplary values. Similarly, value data is transmitted serially from memory over the data_in bus under the control of the controller which generates the read address for the compressed matrix data. Alternately data can be transmitted from memory in groups of non-zero entries, for instance 2×32-bit values can be transmitted over a 64-bit bus, without loss of generality although at the cost of increased wiring. The behaviour of the controller is controlled by the decompression logic and the compressed bitmap register and a clock-cycle is allowed to generate the number of bytes to be fetched (byte_fetch) starting at the base-address using the write address calculator.

The write address calculator comprises a tree of 2 s complement integer adders to compute the Write Addresses (WA) for each entry in the on chip memory (register-file). Each adder in the tree has two inputs. The first input is the corresponding value from the bitmap register, i.e. the first entry (MCB0) in the bitmap register is an input to the first adder. Similarly, the last entry (MCB8) in the bitmap register is an input to the last adder in the tree. The second input to each adder comprises the output from the previous adder in the tree, thus the output of the first adder (WA0) is an input to the second adder and similarly the output of the eighth adder (WA7) is an input to the last adder.

As the first adder has no adder lower in the tree, a base input of −1 is provided, this is to ensure correct addressing when storing data in the expanded structure in the register file. The tree of small integer adders generates the register file destination (write) addresses based on entries in the MAP register. The particular example shown is a 9-entry register file and the base address of the adder tree is set to −1. In the case of a larger register file (more than 9 entries) the 3×3 matrix can be decompressed starting from a base address by setting the base address of the adder-tree to base_adr−1. In the latter case the 3×3 matrix will be located in the register-file starting at the specified base-address rather than at location 0.

In addition, the output from the last adder in the tree of adders is provided as a byte_fetch value which indicates to the (AGU\DMA) controller how many non-zero values need to be retrieved from memory. These bytes will be loaded in sequential fashion on a data bus (data_in). In the case data is transmitted over a wider bus in pairs or groups of 4 either 1 or 2 least-significant-bits (lsbs) will be deleted (and rounded up) from the byte_fetch value to denote the number of 64 or 128-bit data words to be transferred.

The write address comparator comprises a tree of 2 s complement integer comparators to compare the Write Addresses (WA) against a word pointer (wrd_ptr) value, which is a counter output provided by the controller and increments from zero up to the value of the byte_fetch output from the end of adder tree.

The combiner comprises a tree of AND gates to AND each write address comparator output with its corresponding bitmap register value to generate the Write Enable (WEN) signals to allow data from the data bus to be loaded into the register file at the appropriate location. In particular, the wrd_ptr value is compared against the WA addresses (outputs) generated by the adder tree to determine when and where data should be latched into the register file.

In circumstances, where the entry in the bitmap register is zero (e.g. MCB1, MCB3, MOB5, MCB7) it is clear that the output of the associated AND gate (WEN1, WEN3, WEN5, WEN7) will never be enabled and that no data will be loaded into the corresponding locations (r1, r3, r5, r7) in the register file. For this reason, they are not shown in the timing diagram. The register file may be cleared (set to all zero values) as an initial step in the process. When the comparator value matches AND the corresponding MCB-bit is set to 1 the reg-file WEN (write-enable) bit is set high. The WEN bit if set causes the contents of the data_in bus to be written to the correct register-file register. In the example shown, the first Write Enable signal (WEN0) will be enabled when the wrd_ptr is at zero, i.e. to load the first non-zero element (A) into location r0 of the register file. Similarly, the third Write Enable signal (WEN2) will be enabled when the wrd_ptr value is at 1 since WA2=MCB2{1}+WA1{=MCB1(0)+WA0(0)}=1 and thus the second non-zero data value (B) will be loaded from the data bus into the third register location r2.

As a result, at the end of the decompression\expansion process, the register file will have the uncompressed structure stored therein, which in the example shown will represent A,0,B,0,C,0,D,0,E,0.

It will be appreciated that the same general principle outlined here for a 3×3 compressed matrices can be used to support any arbitrary N×M compressed matrix, and any arbitrary-sized register file destination for decompressed matrix entries.

A similar arrangement may be employed in the compression path (compression circuit). In the case of the compression path, shown in FIG. 7, a tree of floating-point comparators is required to compare each data value in the uncompressed data structure (i.e. each register file entry) to 0.0 and set a bitmap entry bit to 1 where register file entries are non-zero. In the example of IEEE single-precision register entries for a 9-entry register file 9 such floating-point comparators are required.

Figure 7:
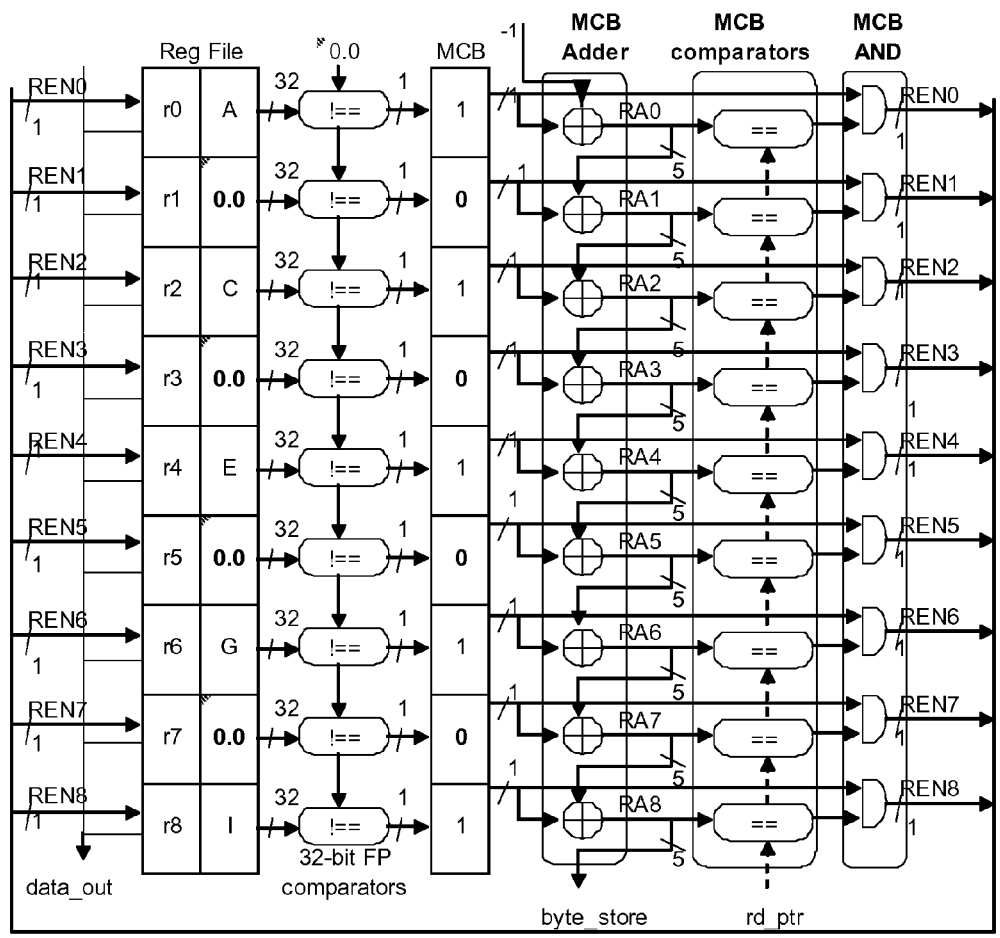
FIG. 7 is an exemplary decompression circuit suitable for inclusion in the processor of FIG. 4.
Figure 8:
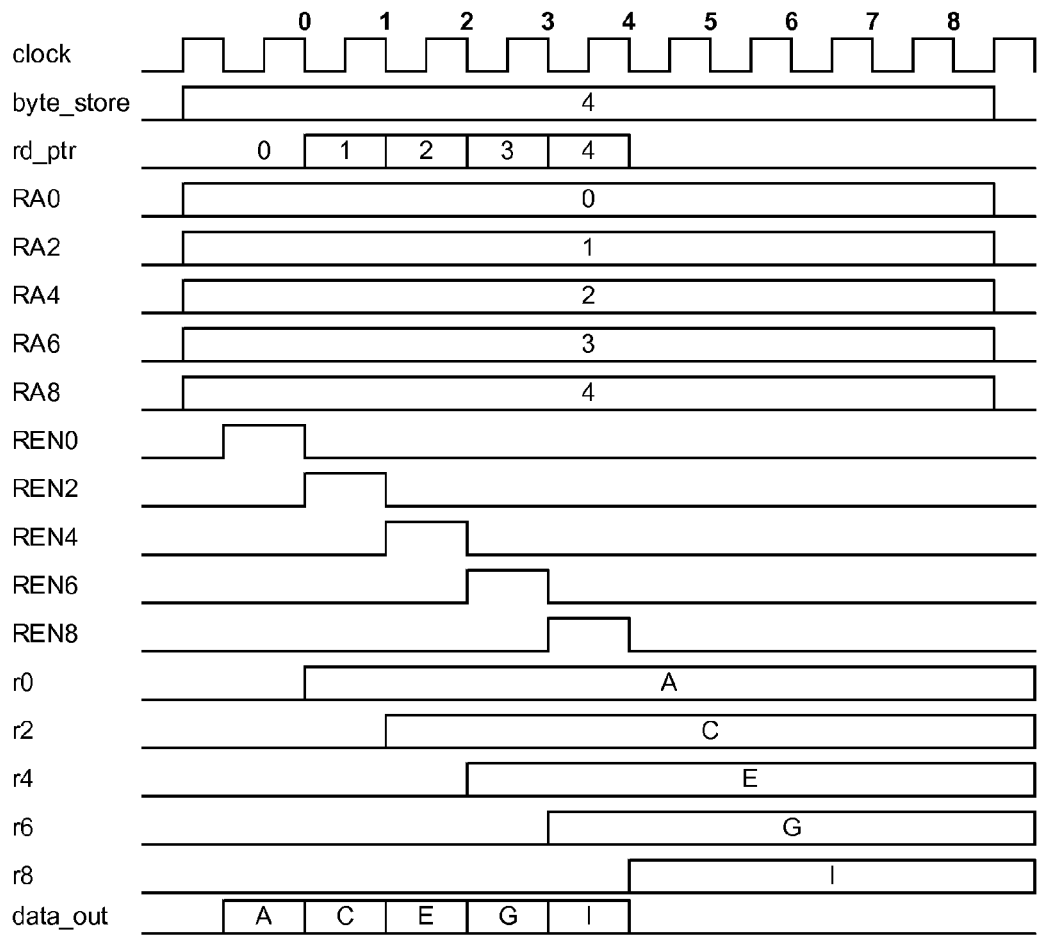
FIG. 8 is an exemplary timing diagram to explain the operation of FIG. 7.

The exemplary compression circuit, as shown in FIG. 7, comprises a bank of 32 bit comparators, a compression bitmap register, a read address calculator, read address comparators and a combiner. As with the expansion circuit described above, these elements are under the control of a controller, for example an Address Generation Unit (AGU) or Direct Memory Access (DMA) controller. The construction and operation of these elements will now be explained in greater detail with reference to the exemplary timing diagram of FIG. 8.

In the exemplary arrangement, the uncompressed structure (r0-r8) is stored in a register file, each of the values in the register is provided to a corresponding comparator in the comparator bank, where a comparison is performed to determine whether the individual value is a non-zero value or a zero-value.

Although, the comparators are shown as reading values from the register file, it may be more advantageous to have a zero-bit register indicating which of the entries in the register file are zero\non-zero values. This register could be populated as data is latched to the write ports of the register file. This zero-bit register may be advantageously employed for other purposes (for example to accelerate calculations) and is described in greater detail in a co-pending application of the same applicant. This approach saves a clock-cycle since there is no need for a comparison at the start of the compression cycle. In addition, the requirement for having 9 read-ports to perform the parallel comparisons on the register file is removed which is very expensive to implement both in terms of wiring and in terms of power. Further advantages of this approach include a reduction in the number of floating-point comparators is required (3× in the exemplary arrangement where there are three write ports to the Register File).

It should be noted that in processors with multiple load/store ports the compression/decompression logic, which can be shared in the case of a processor with a single load/store port must be duplicated, once for each independent load/store port, whether a single shared register-file or multiple independent register-files are employed.

Nonetheless, for ease of explanation the mode of operation will be discussed with reference to the arrangement of FIG. 7, in which the individual outputs from the comparator bank are provided as inputs to a compression bitmap register, which as described above is a register of sufficient size to store the map for the compressed\uncompressed matrix structure. However, it will be appreciated that once the bitmap register is loaded, the manner of operation will be the same between the two different arrangements. The comparator outputs are loaded into the compression bitmap register as a first step in the compression process. It will be appreciated that the values shown in the bitmap register in FIG. 7 are purely exemplary values.

The behaviour of the controller is controlled by the compression logic and the compressed bitmap register and a clock-cycle is allowed to generate the number of bytes to be stored (byte_store—discussed below) starting at the base-address using the read address calculator.

The read address calculator comprises a tree of 2 s complement (in the example shown 5-bit) integer adders to compute the Read Addresses (RA) for each entry in the on chip memory (register-file). Each adder in the tree has two inputs. The first input is the corresponding value from the bitmap register, i.e. the first entry in the bitmap register is an input to the first adder. Similarly, the last entry in the bitmap register is an input to the last adder in the tree. The second input to each adder comprises the output from the previous adder in the tree, thus the output of the first adder (RA0) is an input to the second adder and similarly the output of the eighth adder (RA7) is an input to the last adder.

As the first adder has no adder lower in the tree, a base input of 0 (i.e. no input) is provided, this ensures correct addressing when reading data from the register file. The tree of integer adders generates the register file destination (read) addresses based on entries in the MAP register.

The output from the last adder in the tree of adders is provided as a byte_store value which indicates to the (AGU\DMA) controller how many non-zero values need to be stored in the compressed structure in on or off-chip memory. These bytes will be stored in sequential fashion via a data bus (data_out).

The read address comparator comprises a tree of 2 s complement integer comparators to compare the Read Addresses (RA) against a word pointer (rd_ptr) value, which is a counter output provided by the controller and increments from zero up to the value of the byte_store output from the end of adder tree.

The combiner comprises a tree of AND gates. Each AND gate combines the read address comparator output with its corresponding bitmap register value to generate the Read Enable (REN) signals to allow data to be extracted from the register file at the appropriate location. In particular, the rd_ptr value is compared against the RA addresses (outputs) generated by the adder tree to determine when and where data should be read from the register file.

In circumstances, where the entry in the bitmap register is zero (e.g. MCB1, MCB3, MOB5, MCB7) it is clear that the output of the associated AND gate (REN1, REN3, RENS, REN7) will not be enabled and that no data will be read from the corresponding locations (r1, r3, r5, r7) in the register file. For this reason, they are not shown in the timing diagram. When the comparator value matches AND the corresponding MCB-bit is set to 1 the reg-file REN (read-enable) bit is set high. The REN bit if set causes the contents of the selected entry in the register file to be placed on the data_out bus. In the example shown, the first Read Enable signal (REN0) will be enabled when the rd_ptr is at zero, i.e. to read the first non-zero element (A) onto data_out from location r0 of the register file. Similarly, the third Read Enable signal (REN2) will be enabled when the rd_ptr value is at 2 since RA2=MCB2{1}+RA1{1}=2 and thus the second non-zero data value (C) will be latched from the third register location r2 onto data_out.

As a result, at the end of the compression process, the register file will have placed the values A, C, E, G and I onto data_out which are stored by the controller in on or off-chip memory along with the map from the map register.

It will be appreciated that the same general principle outlined here for a 3×3 uncompressed matrices can be used to support any arbitrary N×M uncompressed matrix.

It will be understood from the above explanations, that the same hardware may be employed for compression and decompression under the general control of a controller.

Figure 9:
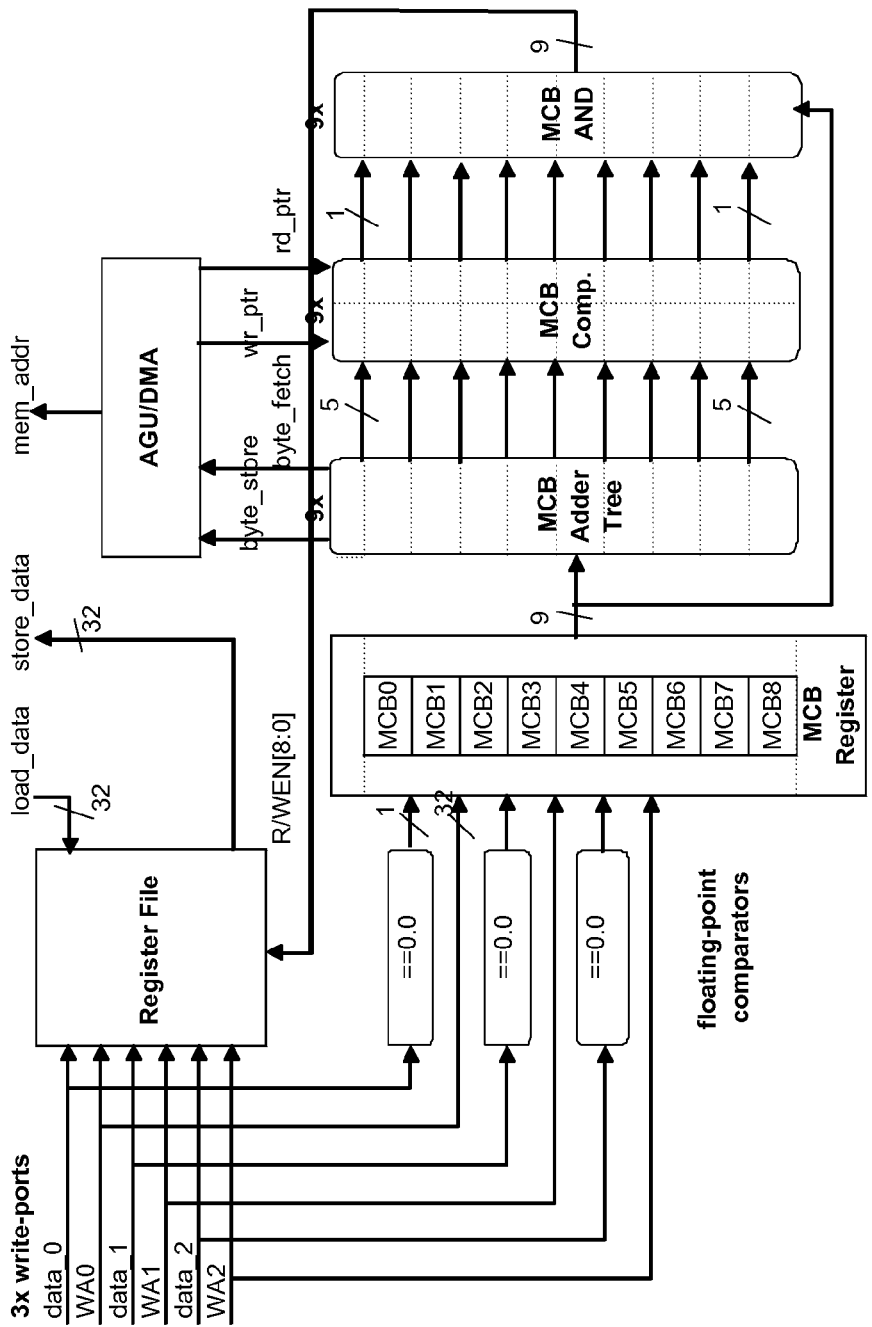
FIG. 9 is an exemplary structure illustrating how the circuits of FIG. 5 and FIG. 7 may be combined.

Such a combined arrangement is shown in FIG. 9, which also incorporates the arrangement of having comparators attached to the register-file write-ports discussed above. In this example the processor data-path connected to the register-file requires 3 write-ports. In practice the proposed scheme can easily be extended to an arbitrary number of register-file write-ports and to register-files with an arbitrary number of entries. It will be appreciated that the wr_ptr, rd_ptr and other signals will be operated\received by the controller as required to compress data for on or off-chip storage or to expand data as it loaded from on or off-chip storage into the register file.

The base_addr of −1 has not been shown for ease of illustration.

An additional execute pipeline stage may be required in order to ensure that the delay of the write-back floating-point comparators does not occur in series with the execute path of the processor as this might otherwise limit the maximum clock-rate and hence FLOPS rate of the processor.

The new approach described in this application provides a number of significant advantages including, for example, a decrease in the memory bandwidth required by a processor by reducing the memory required to store trivial values, a decrease in the size of buses required to move scalar, vector and matrix data, whether compressed or uncompressed, efficiently in terms of bandwidth across on- or off-chip buses to and from memory, a reduction in power dissipation, increasing the effective processing power (FLOPS) of a processor when operating on compressed scalar, vector and matrix data when read from memory or processor registers, and decreasing the latency of a processor.

In the accompanying drawings it will be appreciated that the lines shown may correspond to a plurality of lines and that this is represented by the strike through lines with an adjacent number, thus for example the store_data bus in FIG. 9 represents a 32 bit bus, whereas each output from the Adder tree is 5 bits.

The words comprises/comprising when used in this specification are to specify the presence of stated features, integers, steps or components but does not preclude the presence or addition of one or more other features, integers, steps, components or groups thereof.

The invention claimed is:

1. A compression circuit comprising:
 a) a data memory for storing a data structure comprising individual data values,
 b) a bit map memory for storing a map, the map storing bits representing the locations of individual zero data values and locations of individual nonzero values within the data structure, wherein a bit is set to zero when an entry in the data structure corresponding to the bit is zero and the bit is set to one when the entry in the data structure corresponding to the bit is non-zero, and
 c) a data output, wherein the circuit is configured to retrieve non-zero data from the data structure in the data memory using the map and provide the retrieved data itself as a compressed data structure in combination with data representing the map on the data output; and
 wherein the data output further comprising an arrangement of adders, each adder accepting an input from the bit map memory, and a plurality of comparators, each comparator comparing two integer inputs, the first input of each comparator being an output from a corresponding adder in the arrangement of adders and the second input to each comparator is a sequencing signal.

2. A circuit according to claim 1, wherein the data memory comprises a plurality of registers.

3. A circuit according to claim 1, wherein the data memory comprises a register file.

4. A circuit according to claim 1, wherein the map memory comprises a register.

5. A circuit according to claim 4, wherein the locations are stored as a bit map.

6. A circuit according to claim 5, wherein each bit in the bit map corresponds to an individual data value in the stored structure.

7. A circuit according to claim 1, further comprising the plurality of comparators, each comparator identifying whether a data value is non-zero, the output of each comparator being provided as an input to the map memory and the first input of each comparator being an output from a corresponding adder in an adder tree.

8. A circuit according to claim 7, wherein the comparator inputs are provided by read ports of the data memory.

9. A circuit according to claim 7, wherein the comparator inputs are provided by write ports of the data memory.

10. A circuit according to claim 7, wherein the comparator inputs are provided by a processor load/store ports.

11. A circuit according to claim 2, wherein the data output comprises a data bus and the circuit is configured to sequentially output the compressed structure from the memory onto the data bus.

12. A circuit according to claim 2, further comprising at least one adder for calculating the number of non-zero values from the map.

13. A circuit according to claim 2, further comprising logic for sequentially enabling the writing of non-zero data from the memory to the data output.

14. A circuit according to claim 13, wherein the logic comprises the arrangement of adders.

15. A decompression circuit for decompressing a compressed data structure, the circuit comprising:
   a) an input for accepting a compressed data structure of individual non-zero data values,
   b) a map register for receiving a map identifying the locations of individual non-zero data values within the decompressed structure with bits, wherein bits in the map register are set to zero when an entry in the decompressed structure corresponding to the bit is zero and the bit is set to one when the entry in the decompressed structure corresponding to the bit is non-zero, and
   c) a memory for storing the decompressed data structure, wherein the circuit is configured decompress the compressed data structure by populating the locations of an unpopulated uncompressed data structure which are specified in the map register as being locations of non-zero data with individual inputted non-zero data values from the compressed data structure and by further populating the locations of the unpopulated uncompressed data structure which are specified in the map register as being locations of zero data with zero data to provide an uncompressed and populated data structure; and
   wherein the input comprising an arrangement of adders, each adder accepting an input from the bit map memory, and a plurality of comparators, each comparator comparing two integer inputs, the first input of each comparator being an output from a corresponding adder in the arrangement of adders and the second input to each comparator is a sequencing signal.

16. A circuit according to claim 15, wherein each bit in the bit map corresponds to an individual data value in the decompressed structure.

17. A processor chip comprising:
a compression circuit including:
   a) a data memory for storing a data structure comprising individual data values,
   b) a bit map memory for storing a map, the map storing bits representing the locations of individual zero data values and locations of individual nonzero values within the data structure, wherein a bit is set to zero when an entry in the data structure corresponding to the bit is zero and the bit is set to one when the entry in the data structure corresponding to the bit is non-zero, and
   c) a data output, wherein the circuit is configured to retrieve non-zero data from the data structure in the data memory using the map and provide the retrieved data itself as a compressed data structure in combination with data representing the map on the data output, wherein the compression circuit is responsive to an instruction to store a data structure; and
   wherein the data output further comprising an arrangement of adders, each adder accepting an input from the bit map memory, and a plurality of comparators, each comparator comparing two integer inputs, the first input of each comparator being an output from a corresponding adder in the arrangement of adders and the second input to each comparator is a sequencing signal.

18. A processor chip according to claim 17, wherein the compression circuit is adapted to provide a map identifying the locations of non-zero values in the structure.

19. A processor according to claim 17, further comprising a decompression circuit responsive to an instruction to load compressed format data, the decompression circuit being adapted to repopulate non-zero values into the compressed data as it is loaded.

20. A processor according to claim 19, wherein the decompression circuit employs a map to repopulate non-zero values.

\* \* \* \* \*